(12) United States Patent
Yang et al.

(10) Patent No.: US 6,240,020 B1
(45) Date of Patent: May 29, 2001

(54) METHOD OF BITLINE SHIELDING IN CONJUNCTION WITH A PRECHARGING SCHEME FOR NAND-BASED FLASH MEMORY DEVICES

(75) Inventors: Andrew Yang, Sunnyvale; Shane Hollmer, San Jose; Pau-Ling Chen, Saratoga, all of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/427,406

(22) Filed: Oct. 25, 1999

(51) Int. Cl.$^7$ .................................................. G11C 16/06
(52) U.S. Cl. ........................ 365/185.25; 365/185.12; 365/185.18
(58) Field of Search ...................... 365/185.11, 185.12, 365/185.18, 185.25, 185.33

(56) References Cited

U.S. PATENT DOCUMENTS

| | | |
|---|---|---|
| 4,173,766 | 11/1979 | Hayes . |
| 5,280,446 | 1/1994 | Ma et al. . |
| 5,349,221 | 9/1994 | Shimoji . |
| 5,768,192 | 6/1998 | Eitan . |
| 5,825,686 | 10/1998 | Schmitt-Landsiedel et al. . |
| 5,847,998 | 12/1998 | Van Buskirk . |
| 5,867,430 | 2/1999 | Chen et al. . |

FOREIGN PATENT DOCUMENTS

| | | |
|---|---|---|
| 2 157 489 | 10/1985 | (GB) . |
| WO 99/07000 | 2/1999 | (WO) . |

*Primary Examiner*—Huan Hoang
*Assistant Examiner*—Gene N. Auduong
(74) *Attorney, Agent, or Firm*—Brinks Hofer Gilson & Lione (57) ABSTRACT

A flash memory device includes an array of core cell blocks and page buffers with supporting input/output circuitry. The flash memory device, in addition, contains a method for shielding the bitline for a precharging scheme in which the bitline line of each page buffer is charged prior to the sensing/evaluation cycle of a particular memory element in each core cell block. The precharging scheme increases the speed of response in retrieving information from each core cell block because the bitline line is charged to a predetermined voltage prior to accessing the bitline. The bitline shielding method increases the speed of response further by shielding the effects of neighboring bitlines from each other during the evaluation cycle. The shielding method includes charging different bitlines to preset voltages and then maintaining the preset voltages on a set of the bitlines over the evaluation cycle. The preset voltages are maintained on those bitlines not connected with memory elements undergoing evaluation. The shielding method also includes grounding a latch contained in page buffers connected with the bitlines of memory elements undergoing evaluation prior to the evaluation cycle.

8 Claims, 7 Drawing Sheets

METHOD OF BITLINE SHIELDING IN CONJUNCTION WITH A PRECHARGING SCHEME FOR NAND-BASED FLASH MEMORY DEVICES

BACKGROUND OF THE INVENTION

The present invention relates to a method of bitline shielding in conjunction with a precharging scheme for flash memory devices. More particularly, this bitline shielding method allows for improved sensing of the core cell bit in NAND-based flash memory devices.

The overall array architecture for memory section of a typical NAND-based flash memory device comprises a core memory accessed by an upper and lower bank of page buffers and a right and left bank of word line decoders. The core memory contains information stored in blocks of memory and individual memory cells within the blocks. The right and left word line decoders are used to access specific memory cells within each memory block and the upper and lower bank of page buffers provide the input and output circuitry for each memory cell.

The architecture of one core cell block in the typical NAND-based flash memory device comprises the individual memory elements and select gates. The memory elements and select gates are embodied in non-volatile, floating gate transistors that may be programmed to a logic state of 0, 1 or other states, depending on the particular type of transistor and programming used. The control gates of the transistors that comprise the individual memory elements and select gates in each core cell block are addressed by word lines controlled by the addressing system. The memory elements are connected in series with each other and the select gates. The select gates, at the ends of the chain of memory cells, are connected with either the array common voltage Vss or a bitline. A page buffer is connected with a core cell block via a bitline. The page buffer includes transistors and supporting circuitry that regulate the flow of data into and out of the core cell block and into and out of the external system.

A problem is that the bitline inherently has a large capacitance associated with it due to the proximity of other bitlines. Thus, the bitline has a relatively slow speed of response when data is extracted, or read, from memory elements due to the necessary charging and discharging time. Typically, the time it takes to charge the bitline to the voltage level necessary for sensing is larger than the time it takes to discharge the bitline. Thus, to decrease the cycle time for reading a specific word line, it is more advantageous to decrease the charging time rather than the discharging time.

Previous precharging schemes propose either a mechanism or a method for solving this problem. However, in addition to the charging problems stated above, the capacitance causes another problem to occur after precharging, during evaluation or sensing of a particular memory cell. As described above, a large capacitance exists between neighboring bitlines because of their relative proximity to each other. The problem lies in that if a bitline is pulled close to ground during sensing, neighboring bitlines that are supposed to be held constant at the sensing voltage, are instead coupled via the capacitance to this bitline. In this case, the advantage of precharging the bitline is significantly reduced as the bitline that is supposed to be held at the sensing voltage must be recharged to the sensing voltage from some intermediate voltage point between the sensing voltage and ground before evaluation can be executed.

Figure 8:
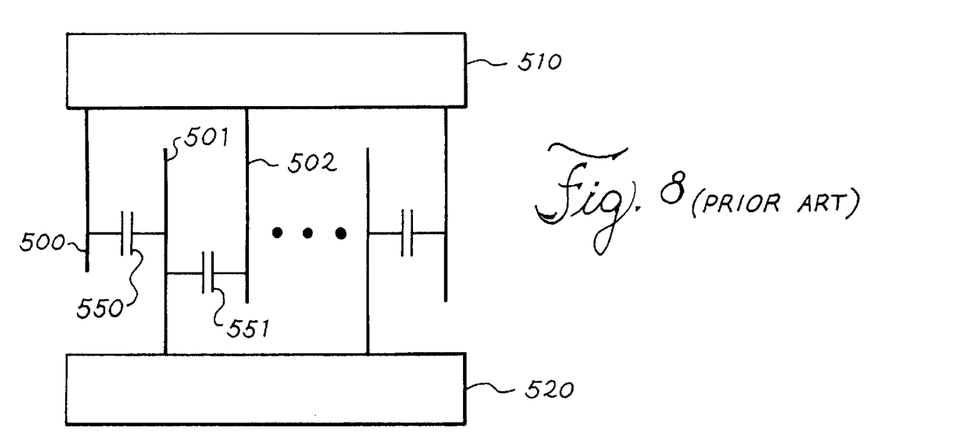
FIG. 8 shows a combination of the page buffers, bitlines and coupling between bitlines in a typical NAND-based flash device.

FIG. 8 shows a combination of the page buffers and bitlines with capacitive coupling between bitlines in a typical NAND-based flash device. In this figure, neighboring bitlines are associated with alternate banks of page buffers. For example, the first bitline 500 is associated with the upper bank of page buffers 510, the second bitline 501 is associated with the lower bank of page buffers 520, the third bitline 502 is associated with the upper bank of page buffers 500, etc. . . . The effect of the capacitative coupling between the bitlines due the their proximity is indicated by the capacitors 550, 551, et al.

Figure 9:
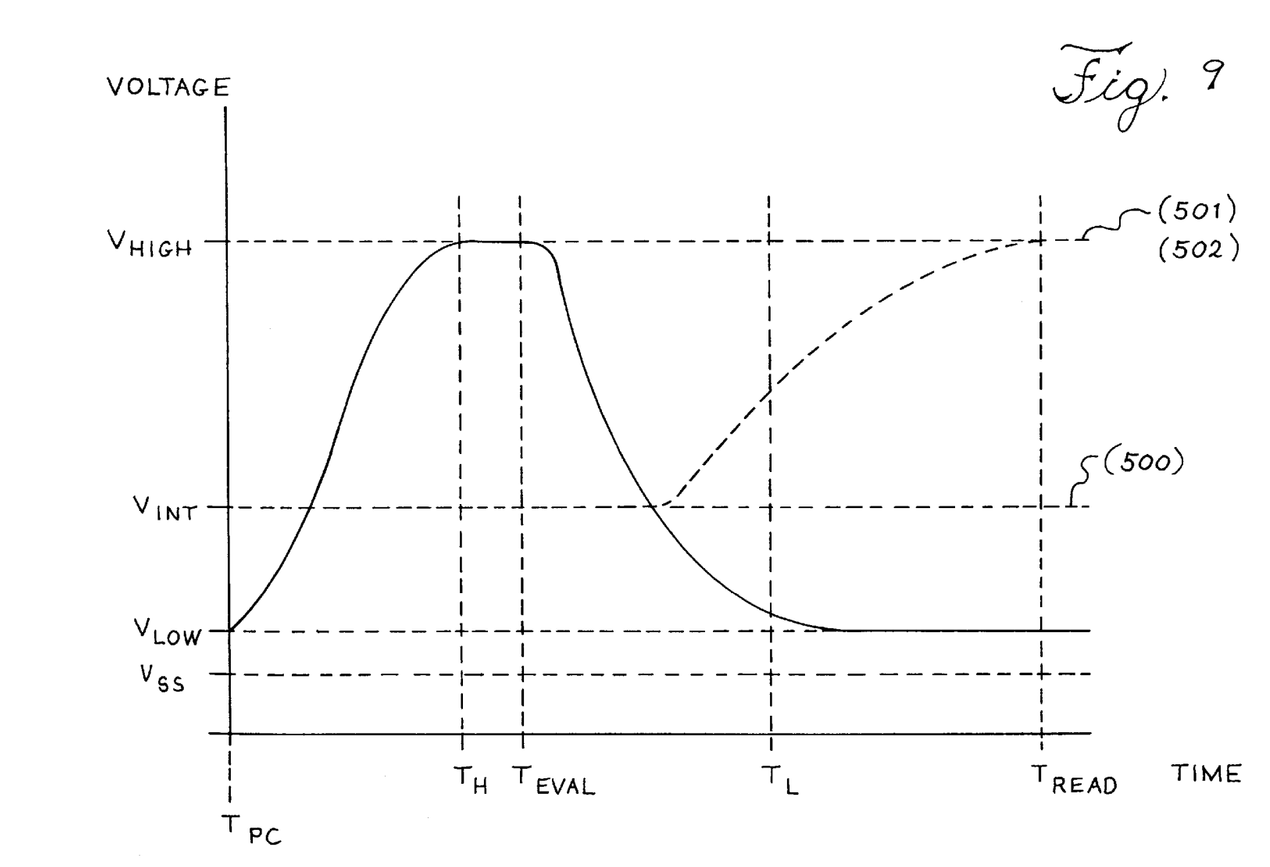
FIG. 9 illustrates the voltage vs. time relationship between neighboring bitlines with different states in a typical NAND-based flash device.

FIG. 9 illustrates the voltage vs. time diagram of a pair of precharged neighboring bitlines, e.g. 500 and 501, the first bitline 500 is pulled down from the sensing voltage to close to ground (Vss) during sensing and the second 501 is supposed to be held at the sensing voltage. The solid line depicts the bitline discharged to near Vss and the dashed line illustrates the neighboring bitline. As shown, at time $T_{pc}$ both bitlines start precharging. The voltages on both bitlines precharge to $V_{high}$ at time $T_h$ in a time $T_{prec}$ and are held at this voltage until the sensing time, $T_{eval}$. At $T_{eval}$, the voltage of the first bitline is discharged over time $T_{disc}$ until time $T_L$, at which point the voltage reaches $V_{low}$. The voltage of the other bitline decreases to $V_{int}$ during effectively the same period. It then takes time $T_{rech}$ to recharge the second bitline to $V_{high}$. It takes a time $T_{read}$ from $T_{eval}$ until the voltage of the second bitline may be read accurately.

Similarly, FIG. 9 also illustrates the voltage vs. time diagram of a pair of precharged next neighbor bitlines as depicted in FIG. 8. The voltage vs. time diagram is valid assuming the intermediate bitline is left floating while the other bitlines are active (or being sensed). This is to say that the extra recharging period for a bitline is also necessary if the first bitline 500 is pulled to close to the ground voltage and the third bitline 502 is left floating at the sensing voltage. This occurs when the upper bank of bitlines 510 is active while the lower bank of bitlines 520 is inactive and the associated bitlines, like the intermediate bitline 501, are floating.

In either case, the time necessary for accurate sensing of a specific memory element, and thus bitline, is increased.

BRIEF SUMMARY OF THE INVENTION

In view of the above, a method of bitline shielding in conjunction with a precharging scheme for a flash memory device is provided.

In a first aspect of the present invention, the bitline shielding arrangement comprises a flash memory device. The flash memory device comprises a plurality of core cell blocks containing flash memory cells, a plurality of page buffers and a plurality of bitlines. Each of the page buffers is in communication with all of the core cell blocks via a unique bitline. The bitlines are contained in two sets that are arranged such that at least one of the second set of bitlines is disposed between each of the first set of bitlines.

The method according to the first aspect of the invention comprises charging the first set of bitlines to a preset voltage during a first portion of a precharge cycle and the second set of bitlines to a second preset voltage. The second set of bitlines are charged concurrent with the first set of bitlines being charged and attain the second preset voltage either before or at the same time as the first set of bitlines attain the first preset voltage. Additionally, the logic state of at least one of the flash memory cells may be evaluated after the first set bitlines have attained the first preset voltage. Each of the flash memory cells undergoing evaluation is connected with a unique bitline contained in the first set of bitlines.

In addition, each page buffer in the flash memory device further comprises a latch and a transistor connected with both the latch and ground. The method according to the first aspect of the invention may further comprise grounding one side of the latch contained in at least each page buffer connected with one of the first set of bitlines via the transistor. The grounding occurs prior to the first set of bitlines attaining the first preset voltage.

A second aspect of the present invention is also directed towards a method of bitline shielding for a flash memory device. The flash memory device comprises a plurality of core cell blocks containing flash memory cells, a plurality of page buffers and a plurality of bitlines. Each of the page buffers is in communication with all of the core cell blocks via a unique bitline. The bitlines are contained two sets arranged such that at least one of the second set of bitlines is disposed between each of the first set of bitlines.

The method according to the second aspect of the invention comprises charging the first set of bitlines to a preset voltage during a first portion of a precharge cycle and the second set of bitlines to a second preset voltage. The second set of bitlines are charged concurrent with the first set of bitlines being charged and attain the second preset voltage either before or at the same time as the first set of bitlines attain the first preset voltage. The first preset voltage may be maintained for the duration of the precharge cycle. Additionally, the logic state of at least one of the flash memory cells may be evaluated during an evaluation cycle. The evaluation cycle occurs after the precharge cycle. Each of the flash memory cells undergoing evaluation is connected with a unique bitline contained in the first set of bitlines.

In an additional step in the second aspect of the invention, each page buffer in the flash memory device further comprises a latch and a transistor connected with both the latch and ground. The method according to the second aspect of the invention further comprises grounding one side of the latch that is contained in at least each page buffer connected with one of the first set of bitlines via the transistor. The grounding occurs prior to the evaluation cycle.

It is therefore a primary advantage of the present invention to increase the speed of response of the flash device by isolating active bitlines from neighboring bitlines during evaluation in conjunction with decreasing the overall charging time associated with the evaluation cycle. The improvement is accomplished by using a shielding method in conjunction with a precharge scheme used to precharge the bitline before reading the data from a particular word line.

The following figures and detailed description of the preferred embodiments will more clearly demonstrate these and other objects and advantages of the invention.

BRIEF DESCRIPTION OF SEVERAL VIEWS OF THE DRAWINGS

FIGS. 4A–I show the timing diagrams for reading data from a particular memory cell according to the first embodiment of the present invention;

FIGS. 5A–I show the timing diagrams for reading data from a particular memory cell according to the second embodiment of the present invention;

FIGS. 7A–D depicts timing diagrams for the pBIAS and CNTRL transistors for an active and shielding bitline according to the present invention;

DETAILED DESCRIPTION OF THE PRESENTLY PREFERRED EMBODIMENT OF THE INVENTION

Figure 1:
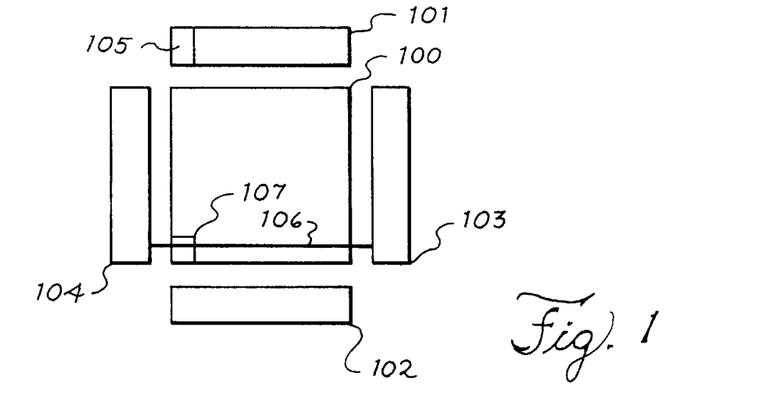
FIG. 1 shows the overall architecture of the memory elements of the flash device according to the invention.

The array architecture associated with the memory device is shown in FIG. 1. The array contains N individual page buffers 105 in each bank of page buffers 101, 102; thus, as there are both an upper 101 and lower 102 bank of page buffers, one entire page or word line 106 contains 2N bits. Left 104 and right 103 banks of decoders are used to select a particular word line. The core memory 100 is split into a set of M core cell blocks 107 with each core cell block 107 being L pages wide. This results in a 2N bits/page×L pages/core cell block×M core cell blocks/core memory 2×L×M×N bytes/core memory. One example of an array architecture used is 256 individual page buffers, a set of 1024 core cell blocks with each core cell block being 16 pages wide. This results in a 2×256 bytes/page×16 pages/core cell block×1024 core cell blocks/core memory=8M bytes/core memory. Of course any numbers presented here are merely illustrative of the principle of the invention as a whole. Those ordinarily skilled in the art will appreciate that the numbers associated with any of these elements, as well as the number of core memory cells in the overall device, may be changed without departing from the spirit and scope of the invention.

Figure 2:
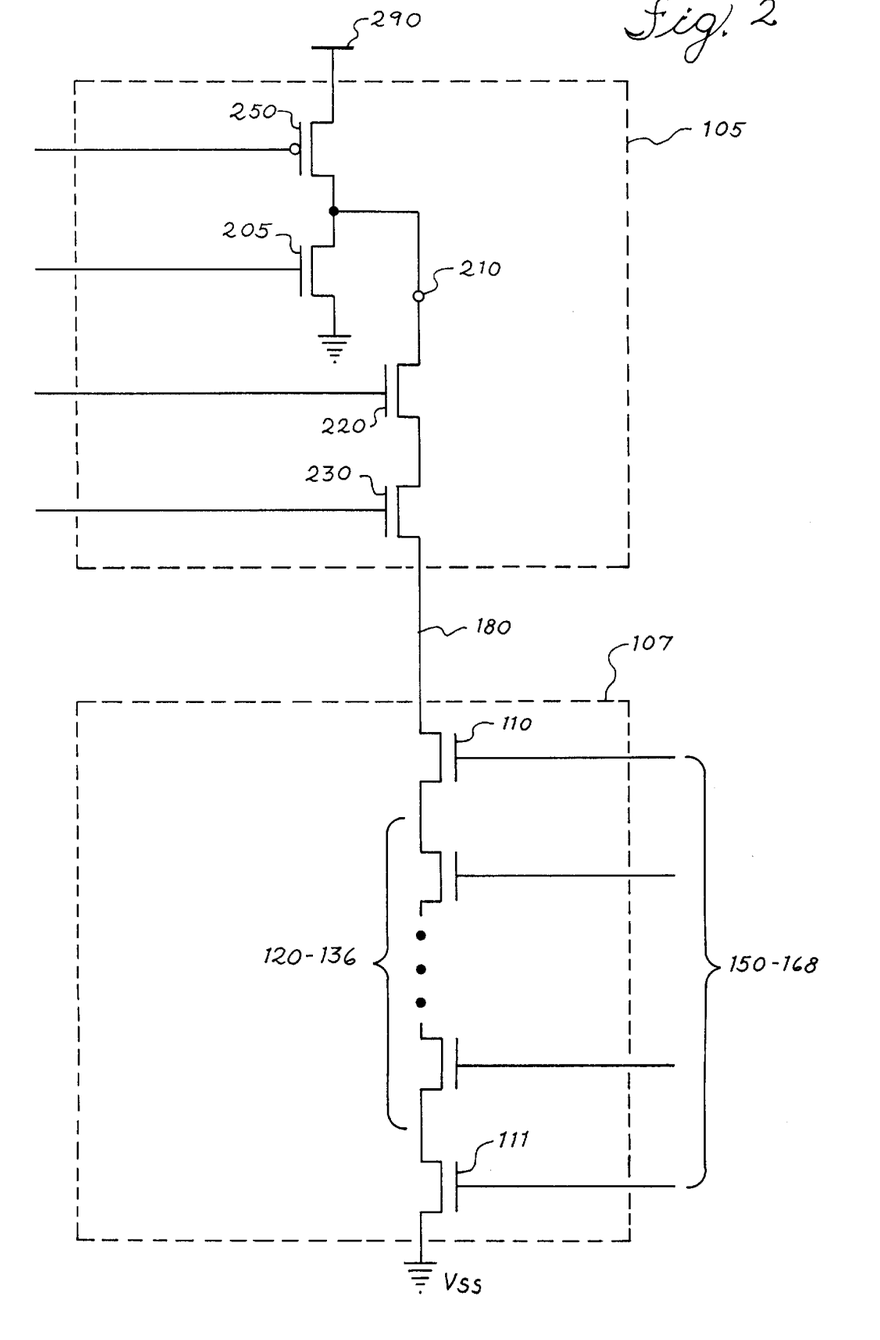
FIG. 2 shows the architecture of a core cell block along with the associated page buffer in a flash memory device according to the invention.

FIG. 2 shows the architecture of one core cell block 107 in the NAND-based flash memory device of FIG. 1 along with the associated page buffer 105. The core cell block 107 comprises 16 individual memory elements 120–136 and two select gates, SG1 110 and SG2 111, for example. As stated before, non-volatile transistors embody the memory elements 120–136 and select gates 110,111. The word lines 151–167 and select gate lines 150, 168 are connected with the control gates of the memory elements 120–136 and select gates 110,111. The memory elements 120–136 and select gates are connected in series. Specifically, the source and drain of the memory elements 120–136 are connected to each other in series. Thus, the source of the first memory element 120 is tied to the drain of the second memory element 121, the source of the second memory element 121 is tied to the drain of the third memory element 122, etc. Accordingly, the select gates 110, 111 are connected to the ends of the chain of memory elements 120–136. The source of SG1 110 is connected with the drain of the first memory element 120, while the drain of SG1 110 is connected with a bitline 180. Similarly, the drain of SG2 111 is connected with the source of the last memory cell 136 and the source of SG2 111 is connected with the array common voltage Vss 199.

The core cell block 107 is connected with a page buffer 105 via a bitline 180. The page buffer 105 includes a sensing node 210, a high voltage control transistor (CNTRL) 220, an optional protection transistor (PROT) 230, a transistor for discharging the bitline 205, an isolation transistor 215, and other essential circuitry 270 well known in the art. The other circuitry 270 includes, for example, circuitry necessary for synchronization and input/output circuitry for transferring data to the external system. The other circuitry 270 includes a latch 280 for latching data onto and out of the bitline 180. Further, the isolation transistor 215 isolates the bitline 180 from the essential circuitry 270 during specific operations and the discharging transistor 205 is used to discharge the bitline 180 when necessary. Similarly, the PROT transistor 230 is a high voltage n-channel transistor used for protecting the circuitry in the page buffer 105 and the memory circuitry in the core cell block 107. The PROT transistor 230 is optional, depending on the specific circuit design.

The page buffer 105, according to the invention, in addition comprises a prebias (pBIAS) transistor 250. The pBIAS transistor 250 is connected with the CNTRL transistor 220 such that the drain of CNTRL 220 is connected with the drain of pBIAS 250, with the SNS node 210 located between the two transistors. The source of pBIAS 250 is connected with the supply voltage Vcc 290, and the source of CNTRL 220 is connected with the bitline 180. The pBIAS transistor 250 is a p-channel transistor, unlike the majority of the other transistors and memory elements in the core cell block 107 and page buffer 105, which are n-channel transistors. The pBIAS transistor 250 allows the bitline 180 to charge up to a preset voltage prior to detection of the output voltage at the sensing node 210 and also provides the sensing current.

The page buffer circuitry 105 comprises an additional n-channel transistor, the PRESET transistor 260 is provided for timing purposes. The n-channel PRESET transistor 260, herein the PRESET transistor, is operational to ground one node of the latch 280 isolated by the isolation transistor 215. The PRESET transistor 260 is activated during the precharging cycle so that the latch 280 is set to a known state before sensing begins. The addition of the PRESET transistor 260 is necessary for purposes of timing of signals associated with external elements of the flash memory device.

Figure 3A:
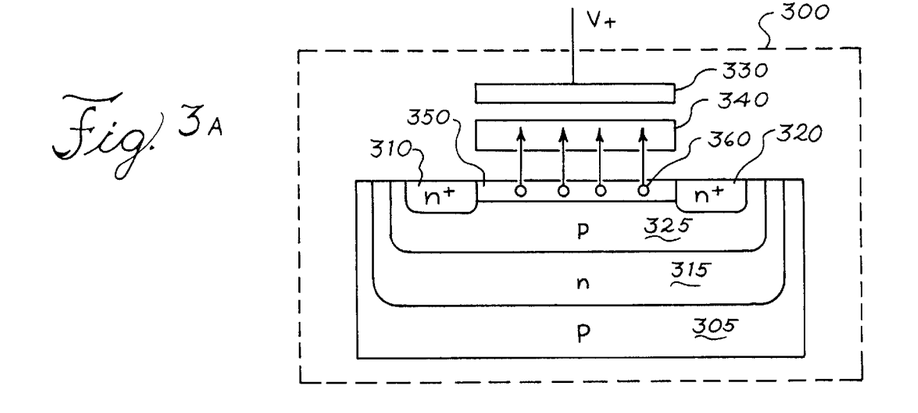
FIGS. 3A, 3B, 3C depict individual memory cell under different operating conditions.
Figure 3B:
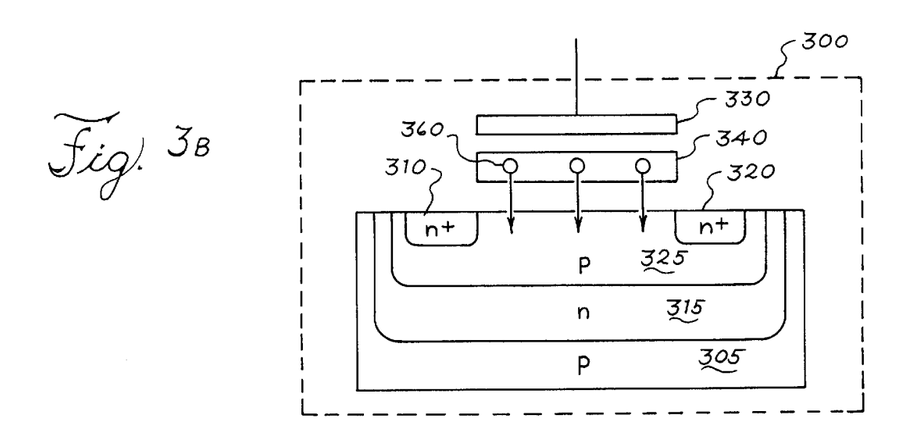
Figure 3C:
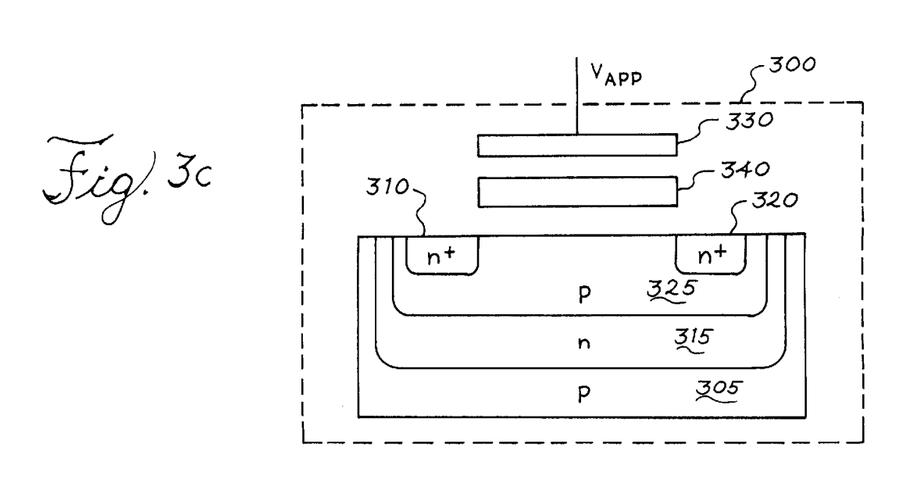

Individual memory elements can undergo three distinct operations, which are shown in FIGS. 3A, 3B and 3C. The three operations are Program, shown in FIG. 3A, Erase, shown in FIG. 3B, and Read, shown in FIG. 3C, and are described below. This discussion will be limited to standard, n-channel, NAND-based non-volatile memory elements, although those skilled in the art will appreciate that the basic operations described herein can be easily extended to at least NOR-based non-volatile memory elements and bi-level non-volatile memory elements in which 4 states can be programmed.

The structure of the memory element 300 is well known in the art: a p-type semiconductor well 325 is disposed within a n-type semiconductor well 315. The n-type semiconductor well 315 is contained within a p-type semiconductor substrate 305. A set of n-type semiconductor junctions comprising the source 310 and drain 320 are disposed within the p-type semiconductor well 325. The p-type semiconductor well 325 and n-type semiconductor well 315 are usually maintained in reverse bias during device operation to avoid current flow from one of the well regions to the other.

The memory element further includes a control gate 330 and a floating gate 340. The gates 330, 340 are conventionally formed from polysilicon deposited and patterned on the surface of the substrate, although the floating gate 340 may alternately be formed from an ONO layer. The gates 330, 340 are formed such that an oxide is formed on part of the substrate with the floating gate 340 formed above the oxide. The control gate 330 is formed above the floating gate 340 and isolated from the floating gate 340 by a second oxide. Control signals are applied to the control gate 330.

During the program operation, as shown in FIG. 3A, both the source 310 and the drain 320 of the memory element 300 are connected with Vss (usually ground). Prior to programming, the threshold voltage (or turn-on voltage) of the MOSFET is generally designed to be a negative voltage, so that a channel 350 of electrons 360 exists in the p-type semiconductor well 325 when the gate 330 is grounded. The channel 350 is disposed between the source 310 and drain 320 of the memory element 300. A large positive voltage is applied to the control gate 330, which causes electrons 360 to be trapped onto the floating gate 340 via Fowler-Nordheim tunneling. The threshold voltage of the transistor is increased if electrons are trapped on the floating gate 340. In this case, the threshold voltage of the programmed memory element changes from a negative voltage to a positive voltage.

During the erase operation, as shown in FIG. 3B, the source 310 and the drain 320 of the memory element 300 are left floating while the control gate 330 is grounded at Vss. A large positive voltage is applied to both the p-type semiconductor well 325 and the n-type semiconductor well 315. As a consequence, the electrons 360 trapped on the floating gate 340 enter the p-type semiconductor well 325 via Fowler-Nordheim tunneling. The threshold voltage thus reverts to the original, unprogrammed threshold voltage of the transistor.

During the read operation, as shown in FIG. 3C, the source 310 of the memory element 300 is connected with Vss while the drain is connected with the bitline 180. The voltage applied to the control gate 330 of the memory element 300 is between the threshold voltage of memory elements that have been erased and memory elements that have been programmed. In this case, the threshold voltage of a programmed memory element is positive and that of an erased memory element is negative and thus applying Vss to the control gate 330 is sufficient to differentiate between the two states. The voltage or current is determined at a sense node 210 on the bitline 180 to ascertain the state of the particular memory element selected, either programmed (0) or erased (1).

The preferred embodiment to sensing a specific word line is to charge the bitline before the specific word line is addressed. The bitline is initially charged up to a value close to a predetermined sensing level and then isolated or left floating. Each word line is connected with the control gate of a unique memory element in each core memory cell. In a standard NAND-type flash memory device, to test a specific word line, all of the word line voltages not being tested and the select gate voltages are held at a high enough voltage level to turn the memory element on or open the channel of the transistor. The applied voltage must be greater than the voltage necessary to turn on a programmed memory element, whose threshold voltage is large, as well as an erased memory element, whose threshold voltage is substantially smaller.

As mentioned above, the voltage applied along the specific word line of the memory element to be read must be between the voltage necessary to read an erased memory cell and that necessary to read a programmed memory cell. If the specific memory cell being read has been erased, when the test voltage is applied, a complete circuit from the bitline to ground is created and the bitline discharges. After a specific amount of time, the voltage on the bitline is read at the sensing node (SNS). At this time, if the voltage at the SNS node is approximately the original sensing level, 1.0 V for example, then the circuit connecting the bitline to ground was not completed and the memory cell has been programmed. Thus, charge stored in the floating gate of the memory cell translates to a high voltage at the sensing node on the bitline and corresponds to a logic value of 0. Similarly, a low voltage at the sensing node on the bitline corresponds to a logic value of 1.

Figure 4A:
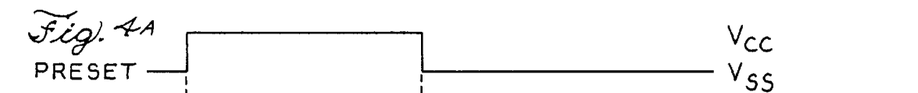
Figure 4B:
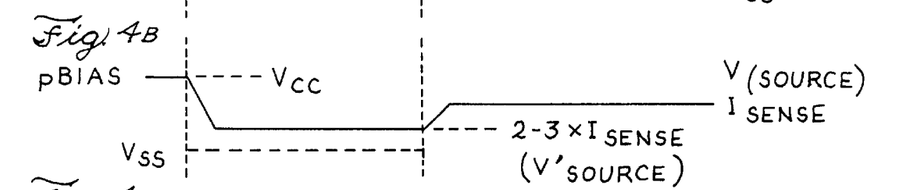
Figure 4C:
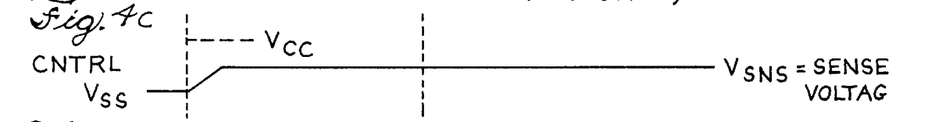
Figure 4D:
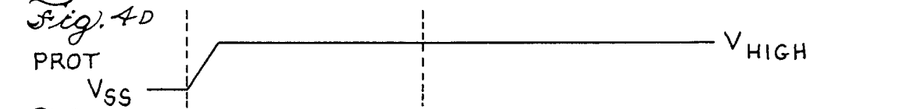

As discussed in the summary, it is an objective of the invention to reduce the time necessary to read a selected word line, thus increasing the speed of response. The timing diagrams for a precharging scheme with the bitline shielding method according to the first embodiment of the invention are shown in FIGS. 4A–I. All input signals are applied to the control gate of transistors and memory elements along active bitlines. Prior to activation of the precharging and subsequent sensing/evaluation of the output signal at the SNS node, the voltage on the PRESET transistor 260 is approximately Vss. The voltage at the SNS node 210 and applied to the CNTRL 220, PROT 230, SG1 110, SG2 111 transistors and all word lines 150–168 are also set to Vss. The voltage applied to the pBIAS transistor 250 is set to approximately Vcc.

In the page buffer 105, the pre-charging sequence starts at time Tpc. At Tpc, Vcc is applied to the PRESET transistor 260 and the voltage applied to pBIAS 250 decreases to a predetermined voltage, turning on the p-channel pBIAS transistor 250. The pBIAS transistor 250 is biased over the precharging time such that it sources a current that is approximately 2–3 times that of the normal current in the bitline during sensing, the normal current in the bitline being 2 $\mu$A, for example. This increase in current allows the bitline to charge to the preset sensing voltage faster without increasing the current/voltage requirements of the chip severely. Also at Tpc, the voltage applied to the CNTRL transistor 220 is increased to maintain the voltage at the SNS node 210 at the sensing level of approximately 1.0 V. As the charge on the bitline increases, the CNTRL transistor 220 clamps the voltage at the SNS node 210 at the sensing voltage level. The voltage applied to the PROT transistor 230, if the PROT transistor 230 is present, is brought to at least Vcc during the precharge cycle.

All word line voltages applied to the individual memory elements in the core cell block 107, except the voltage applied to the word line to be read, are increased at Tpc. The non-read word line voltages are subsequently maintained throughout the entire precharge cycle and evaluation phase at a voltage large enough to turn the transistors on, whether or not they have been individually programmed.

Figure 4E:
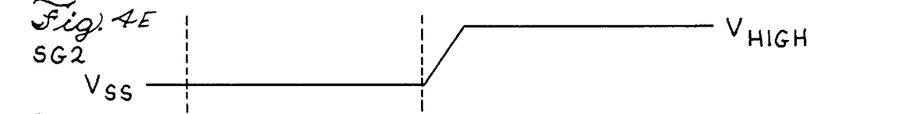
Figure 4F:
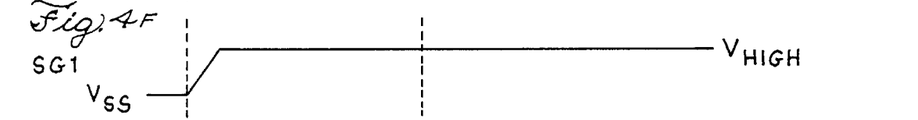
Figure 4G:
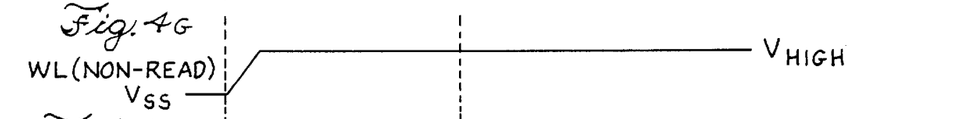
Figures 4H, 4I:
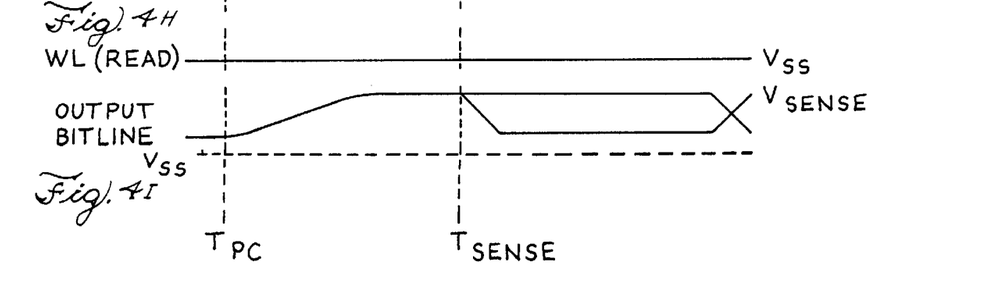

In a first embodiment of the present invention, bitline shielding of a strict precharge scheme, the voltage applied to the select gate transistors SG1 110 and SG2 111 during the precharge cycle are different. As shown in FIGS. 4E and 4F, the voltage applied to SG1 110 is large enough to turn the transistor on, while the voltage applied to SG2 111 remains constant at Vss. In this embodiment, the SNS node 210 charges to the original sensing level of approximately 1.0 V prior to the sensing/evaluation phase.

The evaluation phase occurs after the pre-charging sequence, at time Tsense. The voltages supplied to the transistors in the page buffer 105 are modified at Tsense. The voltage applied to the PRESET transistor 260 is decreased to Vss and the voltage applied to the pBIAS transistor 250 is increased such that the pBIAS transistor 250 sources the original sensing (non-precharging) current in the bitline. The voltage applied to the CNTRL transistor 220 remains constant to keep the SNS node 210 at the sensing voltage and the voltage applied to the PROT transistor 230 remains at Vcc so that the PROT transistor 230 is on, if the PROT transistor 230 is present.

Also occurring in the core cell block 107 at Tsense, the voltage applied to the SG2 111 transistor is increased such that the transistor is turned on. The voltage on the word line to be read is set at an intermediate level, in which the state of the floating gate determines whether or not the transistor is turned on.

In the above strict precharging scheme, the inputs (word lines) do not affect the voltage on the bitline until sensing begins. Little current flows through the core memory cell as the path to ground through the NAND chain is highly resistive. Thus, SG2 111 effectively decouples the inputs from ground when the select gate is not activated.

Figures 5A, 5B:
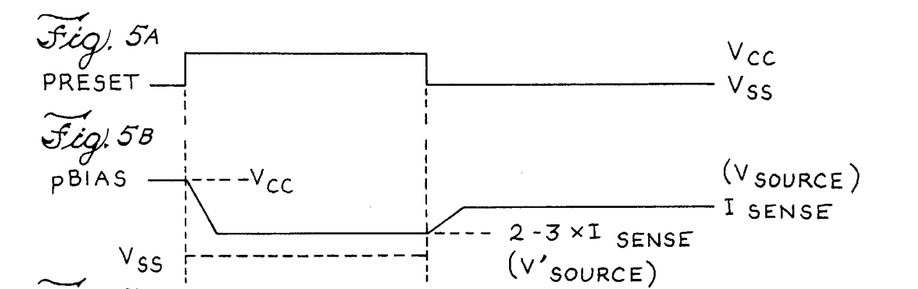
Figures 5C, 5D:
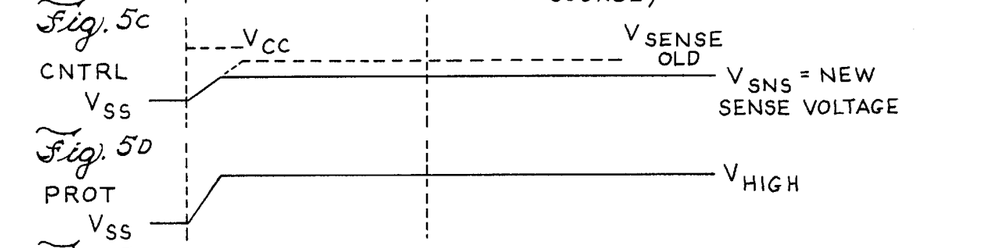
Figure 5E:
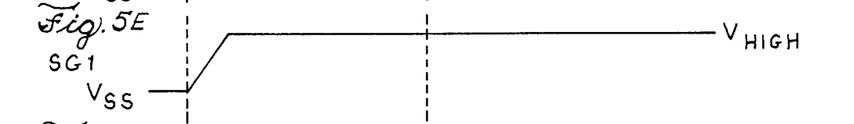
Figure 5F:
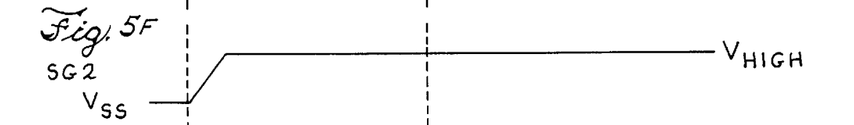
Figures 5G, 5H:
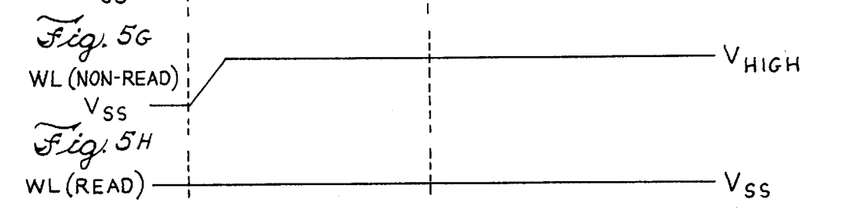
Figure 5I:
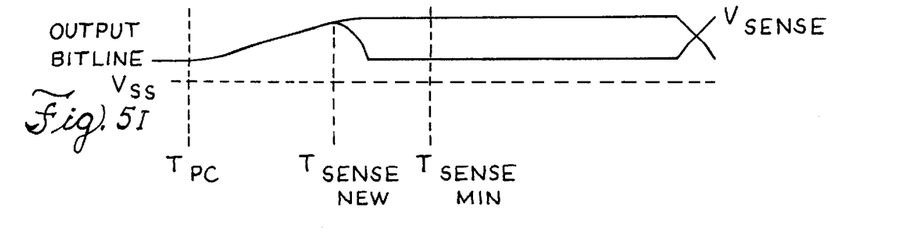

In a second embodiment, bitline shielding with a pseudo-precharge scheme, the inputs are not decoupled from the bitline and thus can affect the voltage on the bitline 180 before sensing begins at time Tsense. FIGS. 5A–I show the timing diagrams associated with the pseudo-precharge scheme. The main difference between the pseudo-precharge scheme and the strict precharge scheme is the timing of the voltages applied to the select gate transistors SG 1 110 and SG2 111. In the pseudo-precharge scheme both SG1 110 and SG2 111 turn on at the same time, Tpc, the time at which the PRESET 260 signal is high. The word lines of the memory cells that are not read are increasing so that the transistors are turning on at the same time and the pBIAS transistor 250 again sources 2–3 times the normal sensing current, as in the strict precharging scheme. The voltage of the word line to be read is maintained at Vss. If the specific memory cell has been erased, a path is created between the bitline 180 and ground and thus, the memory cell sinks current. In this case, the bitline 180 does not get charged all the way to the normal sensing voltage and consequently, sensing occurs at a lower voltage and higher current. For example, the new sensing voltage at SNS 210 may be only 600 mV, instead of the original sensing voltage of 1.0 V. In addition, the sensing time is decreased as the sensing voltage under the pseudo-precharge scheme is decreased.

Figure 6:
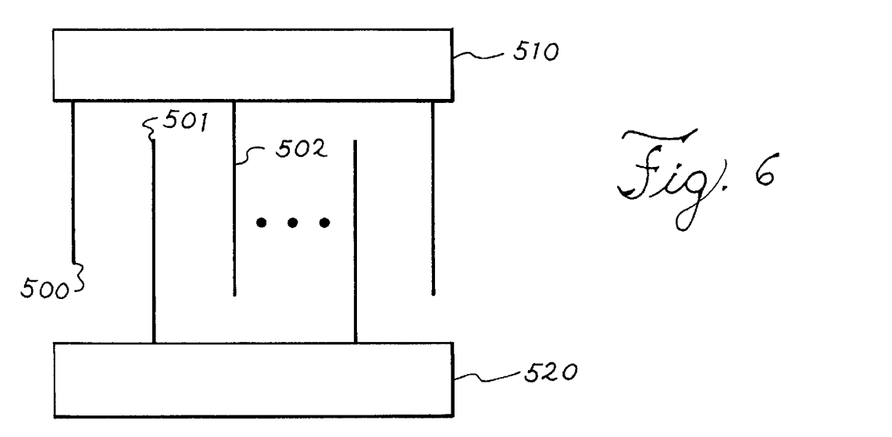
FIG. 6 depicts the banks of page buffers with associated bitlines according to the present invention.

FIG. 6 depicts upper 510 and lower 520 banks of page buffers along with numerous bitlines associated with the banks according to the present invention. The method of bitline shielding described herein requires that only one of the upper 510 and lower 520 banks of page buffers is active/used to read memory elements during the present cycle. In addition, the method of bitline shielding requires that the intermediate/inactive bitlines are set to a specified voltage, usually either near Vss or the supply voltage. FIG. 6 illustrates the method when the upper bank of page buffers 510 is active, the lower bank of page buffers 520 is inactive and the bitlines associated with the lower bank of page buffers 520 are all held at the supply voltage. In this case, if the first bitline 500 is active, the second bitline 501 now is held at the supply voltage (i.e. inactive bitline) and thus shields or isolates the third bitline 502 (i.e. also active) from the first bitline 500. Although only two banks of page buffers have been used for the purpose of illustration, any number of sets of page buffers may be used without departing from the scope of the invention.

Figure 7A:
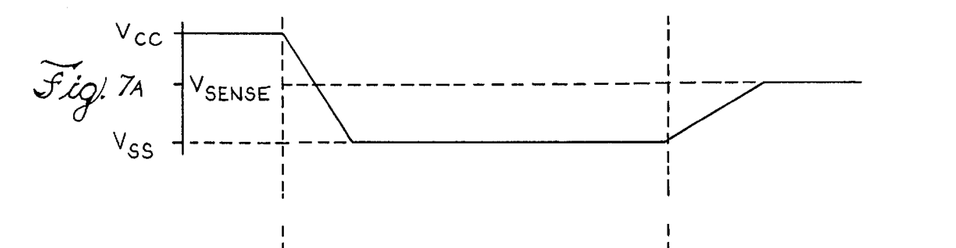
Figure 7B:
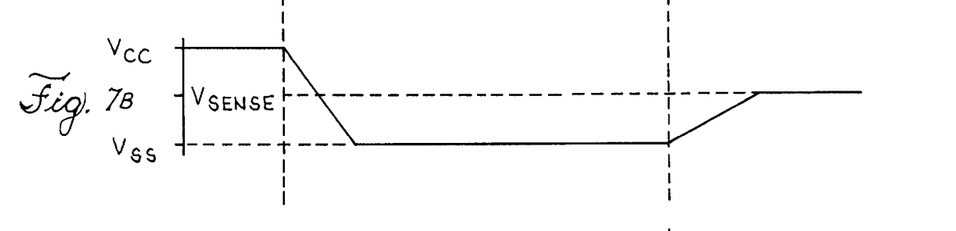
Figure 7C:
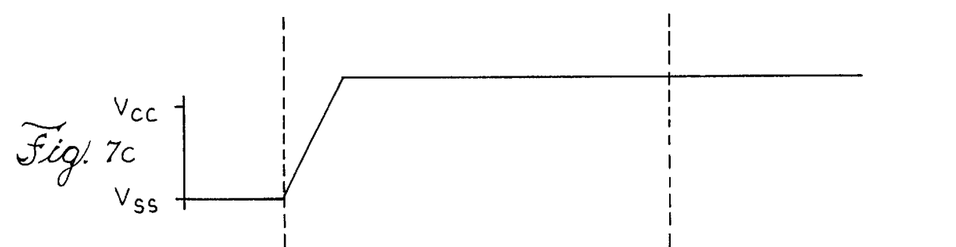
Figure 7D:
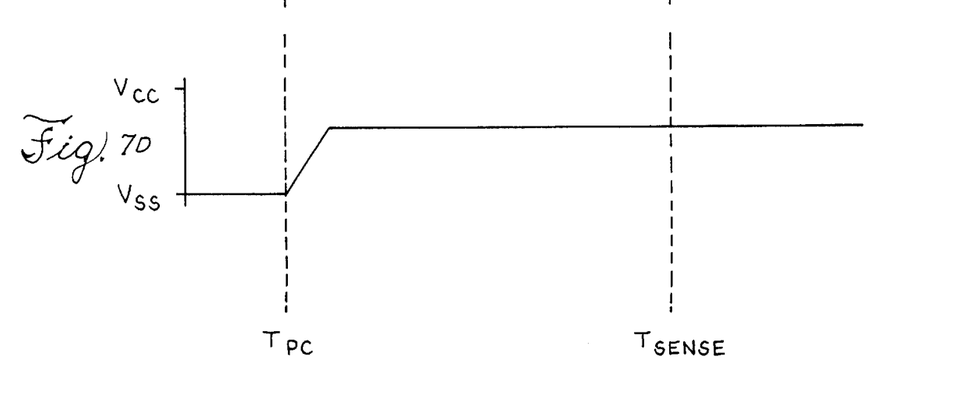

To enable the isolation of the active bitlines from each other, the shielding method must make use of the pBIAS and CNTRL transistors. FIGS. 7A–D depict the timing diagrams for the pBIAS and CNTRL transistors of both an active and a shielding bitline. As in the precharge sequence described above, at the beginning of the precharge cycle, Tpc, the voltage applied to pBIAS of both the active and inactive bitlines decreases to Vss, turning on the p-channel pBIAS transistor, as shown in FIGS. 7A and 7B, respectively. However, at Tpc, while the voltage applied to the CNTRL transistor of the active bitline is increased to attain and maintain the SNS node at approximately 1.0 V, the voltage applied to the CNTRL transistor of the inactive bitline is increased to approximately 4.0 V. The timing diagrams for the CNTRL transistor of the active and inactive bitlines are shown in FIGS. 7C and 7D, respectively. The voltage applied to CNTRL of the inactive bitline is large enough to allow the voltage at the inactive bitline to reach the supply voltage. Sensing once again occurs at Tsense, however, using the method of charging and subsequently maintaining the inactive bitlines, the active bitlines are now isolated from each other.

As can be seen, the invention consists of a precharging scheme for the precharging of bitlines associated with blocks of memory cells in a NAND-based flash device and an accompanying method of shielding specific bitlines. During precharging and subsequent sensing of the bitlines, a portion of the bitlines are active and correspond to individual memory elements that are being read along the active bitlines. The bitlines that are inactive are fixed at a predetermined voltage during the precharging cycle and serve to shield the active bitlines from each other during sensing. The modifications made to the page buffers associated with the core cell blocks comprising the overall memory section of the flash memory device are necessary for both precharging the active bitlines and charging and maintaining the inactive bitlines to the shielding voltage. The modifications necessary to effect the invention include both additional circuit elements and changes in the timing of signals applied to elements within both core cell blocks and page buffers.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

We claim:

1. A method of bitline shielding for a precharging scheme for a flash memory device comprising:

a flash memory device including a plurality of core cell blocks and a plurality of page buffers, each of said core cell blocks containing a plurality of flash memory cells, each of said plurality of page buffers in communication with a fraction of said plurality of core cell blocks via a unique bitline of a plurality of bitlines, said bitlines containing a first set of bitlines and a second set of bitlines and arranged such that at least one of said second set of bitlines disposed between each of said first set of bitlines, the method comprising:

charging said first set of said bitlines to a first preset voltage during a first portion of a precharge cycle;

charging said second set of said bitlines to a second preset voltage during a second portion of said precharge cycle, said second portion of said precharge cycle concurrent with a fraction of and not greater than said first portion of said precharge cycle; and evaluating a logic state of at least one of said flash memory cells during said precharge cycle after each of said first set of bitlines has attained said first preset voltage, each of said at least one of said flash memory cells connected with a unique bitline contained in said first set of bitlines.

2. The method of claim 1 further comprising supplying a current through each of said bitlines of each of said flash memory cells being precharged after said bitline has been charged to said preset voltage, said preset voltage being less than one volt and said current being greater than four microamps.

3. The method of claim 1, each of said plurality of page buffers further comprising a latch having two sides and a transistor connected with both said latch and ground, said method further comprising grounding one side of said latch contained in at least each of said page buffers connected with one of said first set of bitlines via said transistor prior to said first set of bitlines attaining said first preset voltage.

4. A method of bitline shielding for a precharging scheme for a flash memory device comprising:

a flash memory device including a plurality of core cell blocks containing flash memory cells and a plurality of page buffers, each of said plurality of page buffers in communication with a fraction of said plurality of core cell blocks via a unique bitline of a plurality of bitlines, said bitlines containing a first set of bitlines and a second set of bitlines and arranged such that at least one of said second set of bitlines disposed between each of said first set of bitlines, the method comprising:

charging said first set of said bitlines to a first preset voltage during a first portion of a precharge cycle;

charging said second set of said bitlines to a second preset voltage during a second portion of said precharge cycle;

maintaining said first preset voltage for the duration of said precharge cycle;

evaluating a logic state of at least one of said flash memory cells during an evaluation cycle, said evaluation cycle occurring after said precharge cycle, each of said at least one of said flash memory cells connected with a unique bitline contained in said first set of bitlines; and maintaining said second preset voltage after said second preset voltage is reached by said charging for the duration of said precharge cycle and said evaluation cycle.

5. The method of claim 4 further comprising supplying a current through each of said bitlines of each of said flash memory cells being precharged after said bitline has been charged to said preset voltage, said preset voltage being not less than one volt and said current being approximately two microamps.

6. The method of claim 4, each of said plurality of page buffers further comprising a latch having two sides and a transistor connected with both said latch and ground, said method further comprising the step of grounding one side of said latch contained in at least each of said page buffers connected with one of said first set of bitlines via said transistor prior to said evaluation cycle.

7. A method of bitline shielding for a precharging scheme for a flash memory device, said flash memory device comprising:

a plurality of core cell blocks, each of said core cell blocks containing a plurality of flash memory cells;

a plurality of bitlines; and a plurality of page buffers, each of said plurality of page buffers in communication with a fraction of said plurality of core cell blocks via a unique bitline of said plurality of bitlines;

said bitlines containing a first set of bitlines and a second set of bitlines and arranged such that at least one of said second set of bitlines disposed between each of said first set of bitlines;

the method comprising:

charging said first set of said bitlines to a first preset voltage during a first portion of a precharge cycle;

charging said second set of said bitlines to a second preset voltage during a second portion of said precharge cycle, said second portion of said precharge cycle concurrent with a fraction of and not greater than said first portion of said precharge cycle; and evaluating a logic state of at least one of said flash memory cells during said precharge cycle after each of said first set of bitlines has attained said first preset voltage, each of said at least one of said flash memory cells connected with a unique bitline contained in said first set of bitlines.

8. A method of bitline shielding for a precharging scheme for a flash memory device, said flash memory device comprising:

a plurality of core cell blocks, each of said core cell blocks containing a plurality of flash memory cells;

a plurality of bitlines; and a plurality of page buffers, each of said plurality of page buffers in communication with a fraction of said plurality of core cell blocks via a unique bitline of said plurality of bitlines;

said bitlines containing a first set of bitlines and a second set of bitlines and arranged such that at least one of said second set of bitlines disposed between each of said first set of bitlines;

the method comprising:

charging said first set of said bitlines to a first preset voltage during a first portion of a precharge cycle;

charging said second set of said bitlines to a second preset voltage during a second portion of said precharge cycle;

maintaining said first preset voltage for the duration of said precharge cycle;

evaluating a logic state of at least one of said flash memory cells during an evaluation cycle, said evaluation cycle occurring after said precharge cycle, each of said at least one of said flash memory cells connected with a unique bitline contained in said first set of bitlines; and maintaining said second preset voltage after said second preset voltage is reached by said charging for the duration of said precharge cycle and said evaluation cycle.

* * * * *